(12) United States Patent
Sato

(10) Patent No.: US 10,498,213 B2
(45) Date of Patent: Dec. 3, 2019

(54) DRIVE CIRCUIT AND SEMICONDUCTOR MODULE UTILIZING A CAPACITANCE RATIO BETWEEN DIFFERENT SWITCHES

(71) Applicant: FUJI ELECTRIC CO., LTD., Kawasaki-shi, Kanagawa (JP)

(72) Inventor: Tadahiko Sato, Matsumoto (JP)

(73) Assignee: FUJI ELECTRIC CO., LTD., Kawasaki-Shi, Kanagawa (JP)

(*) Notice: Subject to any disclaimer, the term of this patent is extended or adjusted under 35 U.S.C. 154(b) by 0 days.

(21) Appl. No.: 16/018,643

(22) Filed: Jun. 26, 2018

(65) Prior Publication Data
US 2019/0068047 A1   Feb. 28, 2019

(30) Foreign Application Priority Data

Aug. 25, 2017 (JP) ................. 2017-162197

(51) Int. Cl.
| | |
|---|---|
| *H03K 17/0812* | (2006.01) |
| *H02M 1/08* | (2006.01) |
| *H03K 17/16* | (2006.01) |
| *H02M 1/00* | (2006.01) |

(52) U.S. Cl.
CPC ........ *H02M 1/08* (2013.01); *H03K 17/08122* (2013.01); *H03K 17/162* (2013.01); *H02M 2001/0058* (2013.01)

(58) Field of Classification Search
CPC .... H02M 3/1588; H02M 3/337; H02M 7/162; H03K 17/06; H03K 17/063; H03K 17/066; H02K 17/081222
See application file for complete search history.

(56) References Cited

U.S. PATENT DOCUMENTS

| | | | | |
|---|---|---|---|---|
| 4,712,477 A | * | 12/1987 | Aikou ................ | F42C 11/06 102/202.5 |
| 2005/0226018 A1 | * | 10/2005 | Chen ................ | H02M 3/1584 363/132 |
| 2010/0014320 A1 | * | 1/2010 | Nakanishi ........... | H02M 1/38 363/16 |
| 2013/0308347 A1 | | 11/2013 | Sato et al. | |
| 2014/0334214 A1 | | 11/2014 | Katoh et al. | |

(Continued)

FOREIGN PATENT DOCUMENTS

| | | |
|---|---|---|
| JP | 2007-209167 A | 8/2007 |
| JP | 2013-110878 A | 6/2013 |

(Continued)

OTHER PUBLICATIONS

Japanese Office Action dated Oct. 3, 2017.

*Primary Examiner* — Kyle J Moody
*Assistant Examiner* — Peter M Novak
(74) *Attorney, Agent, or Firm* — Rabin & Berdo, P.C.

(57) ABSTRACT

A drive circuit, including a first switch located on a low side of the drive circuit, a second switch located on a high side of the drive circuit and connected in series with the first switch, the first switch and the second switch forming an output circuit, each of the first and second switches having a high-potential end, a low-potential end and a gate terminal, a control unit that controls switching operations of the first switch and the second switch, and a capacitive element having two ends thereof respectively connected to the gate terminal of the second switch and the low potential end of the first switch.

9 Claims, 5 Drawing Sheets

(56) References Cited

U.S. PATENT DOCUMENTS

2016/0301408 A1\* 10/2016 Roberts .............. H03K 17/6877
2017/0345905 A1\* 11/2017 Siemieniec ............ H01L 29/04
2018/0034430 A1\* 2/2018 Ahmed ............... H03F 3/45475
2018/0069545 A1\* 3/2018 Gyoten ................ H03K 17/567

FOREIGN PATENT DOCUMENTS

| JP | 5761206 B2 | 8/2015 |
| JP | 6065744 B2 | 1/2017 |

\* cited by examiner

DRIVE CIRCUIT AND SEMICONDUCTOR MODULE UTILIZING A CAPACITANCE RATIO BETWEEN DIFFERENT SWITCHES

CROSS-REFERENCE TO RELATED APPLICATION

This application is based upon and claims the benefit of priority of the prior Japanese Patent Application No. 2017-162197, filed on Aug. 25, 2017, the entire contents of which are incorporated herein by reference.

BACKGROUND OF THE INVENTION

1. Field of the Invention

The embodiments discussed herein relate to a drive circuit and a semiconductor module.

2. Background of the Related Art

An output circuit including a half bridge circuit having two semiconductor switches connected in series is generally used in a motor drive inverter and a drive circuit of a DC-DC converter of a switching power supply. The semiconductor switches of the output circuit are, for example, an insulated gate bipolar transistor (IGBT) or a metal-oxide-semiconductor field-effect transistor (MOSFET).

FIG. 5 is a circuit diagram partially illustrating an LLC current resonant DC-DC converter.

This DC-DC converter includes a drive circuit including a main control circuit 102 and main switches Q101 and Q102 connected in series to a direct-current power supply 101, as well as an inductor L101, a transformer T101, a capacitor C101, and a direct-current voltage output circuit 103. Here, the main switches Q101 and Q102 are MOSFETs and thus include body diodes D101 and D102 connected in antiparallel to these MOSFETs, respectively.

The main control circuit 102 is connected to the gate terminal of the low-side main switch Q101 and the gate terminal of the high-side main switch Q102. The main control circuit 102 controls the main switches Q101 and Q102 to turn on and off alternatingly. A resonance circuit including the inductor L101, the primary winding of the transformer T101, and the capacitor C101 connected in series is connected to a common connection point between the main switches Q101 and Q102. The direct-current voltage output circuit 103 for rectification and smoothing is connected to the secondary winding of the transformer T101, and outputs and supplies a direct-current voltage to a load.

In the above configuration, when the low-side main switch Q101 is turned off and the high-side main switch Q102 is turned on, the electric current supplied from the positive terminal of the direct-current power supply 101 returns to the negative terminal of the direct-current power supply 101 through the main switch Q102 and the resonance circuit. Then, when both of the main switches Q101 and Q102 are turned off, the electric current of the resonance circuit flows through the body diode D101 of the main switch Q101 in order to continue the electric current in the inductor L101 and the primary winding of the transformer T101. In this case, the change (dV/dt) of the drain-source voltage and the change (dI/dt) of the drain current are generated in the main switch Q101, without ON operation of the main switch Q101.

Thereafter, when the low-side main switch Q101 is turned on before the resonant current flowing through the resonance circuit reverses its direction, the electric current of the resonance circuit flows through the main switch Q101. Then, when both of the main switches Q101 and Q102 are turned off, the resonant current flows through the body diode D102 of the main switch Q102 to continue the electric current in the inductor L101 and the primary winding of the transformer T101, and thereby re-generates and accumulates electric power in the direct-current power supply 101.

By repeating the above operation of the main switches Q101 and Q102, alternate-current voltage generated in the secondary winding of the transformer T101 is rectified and smoothed in the direct-current voltage output circuit 103, which outputs direct-current voltage of a predetermined magnitude.

Here, after electric current changes its direction from the negative direction (commutation current state) to the positive direction in one of the main switches Q101 and Q102, the one of the main switches is turned off to flow the electric current to the other of the main switches Q101 and Q102, and then the other main switch is turned on while the electric current flows in the negative direction in the other main switch. In this manner, a large change of the electric potential is not applied to the body diodes D101 and D102 at the time of turning on. However, when the load of the converter or the input voltage rapidly changes (for example, from an overload state to an unloaded state), when the power supply starts operating, or in like cases, the main control circuit 102 of the converter is unable to follow such a change and turns on the main switch Q102 while the electric current flows through the main switch Q101 in the negative direction in the commutation current state. In this case, the voltage of the direct-current power supply 101 is instantaneously applied to the body diode D101 of the main switch Q101 in a reverse bias state, and the body diode D101 performs recovery operation. In this recovery operation, rapid change dI/dt of the electric current (referred to here as "resonance loss") occurs, possibly destroying the body diode D101.

In the past, the main control circuit 102 has been improved to prevent the rapid change dI/dt of the electric current (for example, refer to Japanese Patent No. 5761206). In Japanese Patent No. 5761206, the main control circuit has a resonance loss prevention function. This resonance loss prevention function monitors the currents or voltages of the main switches and turns on the main switch that is not the main switch through which electric current flows in the negative direction, at a time point that does not cause a resonance loss.

Moreover, there is a method in which gate drive voltage is generated in a direction canceling the rapid current change dI/dt that occurs in a main circuit, by magnetically coupling a gate drive terminal and a terminal through which the main circuit current flows (for example, refer to Japanese Patent No. 6065744).

Furthermore, there is a method that increases the gate resistance in proportion to the main circuit current to reduce the effective forward transfer conductance (gfs) of a main switch, and thereby reduces the performance of the drive circuit of the other switch (for example, refer to Japanese Laid-open Patent Publication No. 2013-110878). That is, in Japanese Laid-open Patent Publication No. 2013-110878, even if electric current continues flowing in the negative direction in one of the switches when the other switch is turned on, the forward transfer conductance of the other switch is low enough to reduce the change dI/dt of the electric current during recovery operation.

However, the technologies described in Japanese Patent No. 5761206 and Japanese Laid-open Patent Publication No. 2013-110878 have a problem of complexity of the drive circuit, because of additional circuits, such as a function for interpreting the state of the main electric current. Moreover, the technology described in Japanese Patent No. 6065744 has a problem of difficulty in circuit layout, because the control terminal (gate drive terminal) is wired along the main circuit to couple the terminals magnetically.

SUMMARY OF THE INVENTION

According to one aspect, there is provided a drive circuit including: a first switch located on a low side; a second switch located on a high side and connected in series with the first switch, the first switch and the second switch forming an output circuit; a main control unit that controls switching operation of the first switch and the second switch; and a first capacitive element having two ends connected between a gate terminal of the second switch and a low potential end of the first switch.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 2A illustrates an output circuit of a drive circuit; and FIG. 2B illustrates behavior performed when a resonance loss occurs.

FIG. 4A illustrates an output circuit of a drive circuit; and FIG. 4B illustrates behavior performed when a resonance loss occurs.

DETAILED DESCRIPTION OF THE INVENTION

Figure 1:
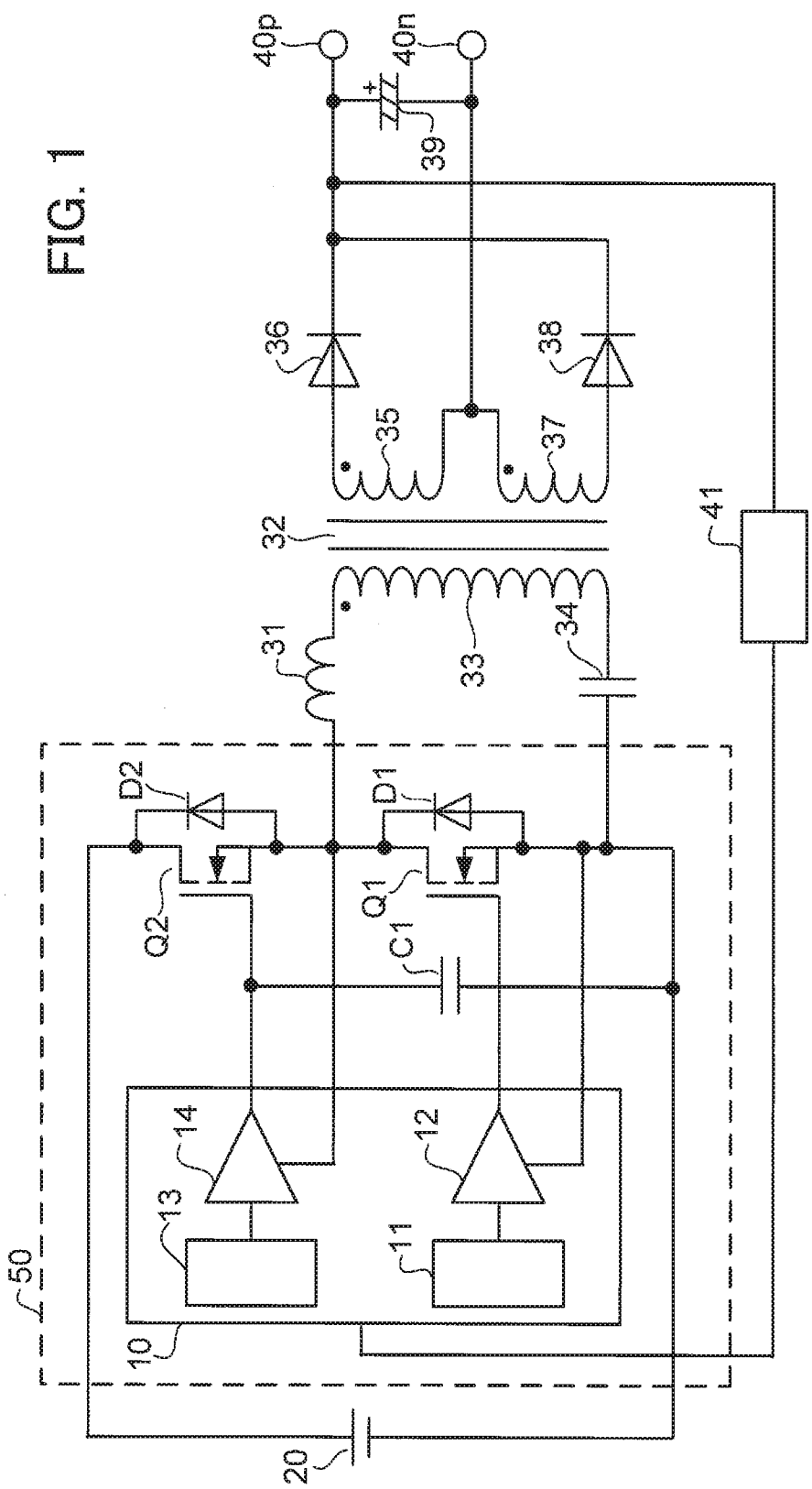
FIG. 1 is a circuit diagram illustrating a configuration example of a DC-DC converter that employs a drive circuit according to a first embodiment.

Several embodiments will be described below with reference to the accompanying drawings, wherein like reference numerals refer to like elements throughout. These embodiments describe application examples of an LLC current resonant DC-DC converter. Note that each embodiment may be carried out by partially combining a plurality of embodiments without inconsistency.

First Embodiment

Figure 2A:
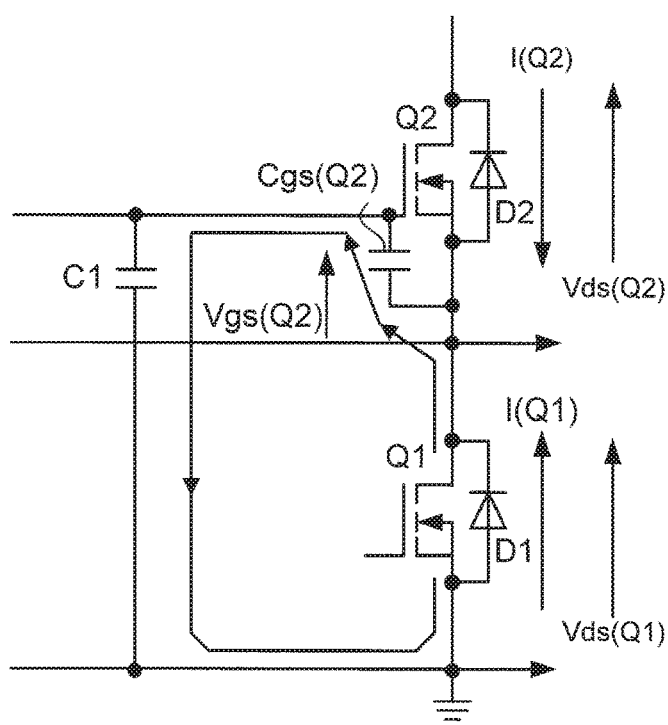
FIGS. 2A and 2B are diagrams for describing operation of a drive circuit according to the first embodiment.
Figure 2B:
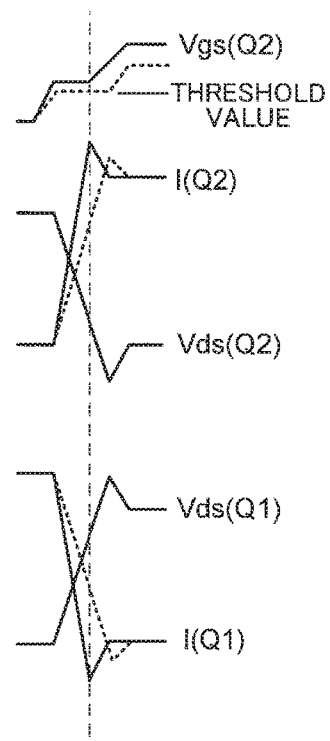

FIG. 1 is a circuit diagram illustrating a configuration example of a DC-DC converter that employs a drive circuit according to a first embodiment. FIGS. 2A and 2B are diagrams for describing operation of the drive circuit according to the first embodiment. FIG. 2A illustrates an output circuit of the drive circuit. FIG. 2B illustrates the behavior performed when a resonance loss occurs.

A DC-DC converter includes a low-side switching element Q1 and a high-side switching element Q2 as main switches. The switching elements Q1 and Q2 are connected in series to form a half-bridge output circuit. In the illustrated example, the switching elements Q1 and Q2 are N-channel MOSFETs and thus include body diodes D1 and D2 connected in antiparallel, respectively. The high potential ends of the switching elements Q1 and Q2 are drain terminals, and the low potential ends of the switching elements Q1 and Q2 are source terminals. Note that the main switches are not limited to N-channel MOSFETs but may employ IGBTs. In the case of IGBTs, the main switches are each configured such that a freewheeling diode (FWD) is connected in antiparallel to an IGBT, or such that an IGBT and an FWD are integrated to form a reverse conducting IGBT (RC-IGBT).

The gate terminals of the switching elements Q1 and Q2 and a common connection point between the switching elements Q1 and Q2 are connected to a main control circuit 10. The main control circuit 10 includes a low-side control circuit 11, a low-side drive circuit 12, a high-side control circuit 13, and a high-side drive circuit 14. The output of the low-side control circuit 11 is connected to the input of the low-side drive circuit 12, and the output of the low-side drive circuit 12 is connected to the gate terminal of the switching element Q1. The output of the high-side control circuit 13 is connected to the input of the high-side drive circuit 14, and the output of the high-side drive circuit 14 is connected to the gate terminal of the switching element Q2.

The gate terminal of the high-side switching element Q2 is connected to a terminal of a capacitor (first capacitive element) C1, and the other terminal of the capacitor C1 is connected to the source terminal (low potential end) of the low-side switching element Q1.

The drain terminal of the high-side switching element Q2 is connected to the positive terminal of a direct-current power supply 20, and the source terminal of the low-side switching element Q1 is connected to the negative terminal of the direct-current power supply 20. The direct-current power supply 20 may be a power factor corrector circuit that converts and boosts the alternate-current voltage of a commercial power supply to direct-current voltage, for example.

The common connection point between the switching elements Q1 and Q2 is connected to a terminal of an inductor 31, and the other terminal of the inductor 31 is connected to a terminal of a primary winding 33 of a transformer 32. The other terminal of the primary winding 33 is connected to a terminal of a resonance capacitor 34, and the other terminal of the resonance capacitor 34 is connected to the source terminal of the low-side switching element Q1. Here, a resonance circuit is formed of the inductor 31, the resonance capacitor 34, and a leakage inductance component between the primary winding 33 and secondary windings 35 and 37 of the transformer 32.

A terminal of the secondary winding 35 of the transformer 32 is connected to the anode terminal of a diode 36, and a terminal of the secondary winding 37 is connected to the anode terminal of a diode 38. The cathode terminals of the diodes 36 and 38 are connected together to an output terminal 40p and the positive terminal of an output capacitor 39. The negative terminal of the output capacitor 39 is connected to an output terminal 40n and a common connection point between the secondary windings 35 and 37. The secondary windings 35 and 37, the diodes 36 and 38, and the output capacitor 39 form a direct-current voltage output circuit of the DC-DC converter that rectifies and smooths the alternate-current voltage generated in the secondary windings 35 and 37 to convert the alternate-current voltage to direct-current voltage and outputs the direct-current voltage.

The positive terminal of the output capacitor 39 is connected to the main control circuit 10 via a feedback circuit 41. The feedback circuit 41 detects the voltage between the terminals of the output capacitor 39, and feeds information of an error between the detected voltage and a target output voltage, back to the main control circuit 10. The main control circuit 10 controls the switching elements Q1 and Q2 to adjust the voltage between the terminals of the output capacitor 39 to the target output voltage on the basis of the error information.

Here, the main control circuit 10 is configured with a monolithic integrated circuit. The drive circuit including the main control circuit 10, the switching elements Q1 and Q2, and the capacitor C1 is contained in one package, which is a semiconductor module 50 called intelligent power module (IPM). In the semiconductor module 50, the capacitor C1 is provided outside the main control circuit 10 as illustrated in FIG. 1, but may be formed in the monolithic integrated circuit of the main control circuit 10.

Next, the operation of the DC-DC converter having the above configuration will be described. First, the main control circuit 10 alternatingly turns on and off the switching elements Q1 and Q2, by means of the low-side control circuit 11, the low-side drive circuit 12, the high-side control circuit 13, and the high-side drive circuit 14.

That is, the LLC current resonant DC-DC converter has first to fourth operation states described below, and controls resonant current by repeating these four operation states.

In the first operation state, the low-side switching element Q1 is turned off, and the high-side switching element Q2 is turned on. In this first operation state, resonant current flows through the switching element Q2 and the resonance circuit in the positive direction, energized by the direct-current power supply 20.

In the second operation state, the switching element Q2 is turned off while electric current flows through the switching element Q2 in the positive direction. In this second operation state, the switching element Q2 is turned off, and immediately thereafter the electric current becomes a commutation current state in which the electric current flows through the body diode D1 of the switching element Q1 in the negative direction toward the switching element Q2, and the resonant current continuously changes in the positive direction. The low-side switching element Q1 is turned on at a time point when the voltage (drain-source voltage) of the switching element Q1 becomes approximately zero while the electric current flows through the body diode D1.

In the third operation state, the electric current flows through the switching element Q1 in the positive direction, when the resonant current changes its direction from the positive direction to the negative direction while the low-side switching element Q1 is turned on.

In the fourth operation state, the switching element Q1 is turned off, while the electric current flows through the switching element Q1 in the positive direction. In this fourth operation state, the switching element Q1 is turned off, and immediately thereafter the electric current flows through the body diode D2 of the switching element Q2 in the negative direction toward the direct-current power supply 20, and the resonant current continuously changes in the negative direction. Also, the high-side switching element Q2 is turned on at a time point when the voltage (drain-source voltage) of the switching element Q2 becomes approximately zero while the electric current flows through the body diode D2.

The switching elements Q1 and Q2 are turned on and off alternatingly, and thereby the resonance circuit (including the inductor 31, the leakage inductance component of the transformer 32, and the resonance capacitor 34) performs resonance behavior, so that resonant current is induced in the secondary windings 35 and 37 of the transformer 32. This induced current is rectified and smoothed by the diodes 36 and 38 and the output capacitor 39 and is output from the output terminals 40p and 40n as direct-current output voltage.

The output voltage output from the output terminals 40p and 40n is detected by the feedback circuit 41, and the feedback circuit 41 feeds the information of an error between the detected voltage and the target output voltage, back to the main control circuit 10. Upon receiving the error information, the main control circuit 10 controls and modulates the pulse widths applied to the switching elements Q1 and Q2 in such a manner to adjust the output voltage to the target output voltage.

Next, an effect of the capacitor C1 provided between the gate terminal of the high-side switching element Q2 and the low potential end of the low-side switching element Q1 will be described. In the output circuit of FIG. 2A, a gate capacitance Cgs(Q2), which is an input capacitance, is illustrated in the high-side switching element Q2 for the purpose of describing the operation. FIG. 2B illustrates the gate voltage Vgs(Q2), the drain current I(Q2), and the drain-source voltage Vds(Q2) of the high-side switching element Q2, and the drain-source voltage Vds(Q1) and the drain current I(Q1) of the low-side switching element Q1, from the top of FIG. 2B. Note that the positive direction of the drain current I(Q1) of the low-side switching element Q1 is the direction flowing from the source terminal to the drain terminal.

First, in the second operation state of the LLC current resonant DC-DC converter, the electric current I(Q1) flows through the body diode D1 of the switching element Q1 in the negative direction, immediately after the switching element Q2 is turned off. In this state, the switching element Q2 starts ON operation, when the operation of the main control circuit 10 is unable to follow the rapid change of the load and the input voltage and the gate voltage Vgs(Q2) exceeds a threshold value to turn on the switching element Q2. Upon the start of ON operation, the drain-source voltage Vds(Q1) of the switching element Q1 is rapidly subject to reverse bias to generate sharp turn-off dv/dt. A part of electric charge generated by this dv/dt forms a transient electric current that flows a loop starting from the drain of the switching element Q1 via the gate capacitance Cgs(Q2) of the switching element Q2 and the capacitor C1 and returning to the source of the switching element Q1. This electric current flows through the gate capacitance Cgs(Q2) of the switching element Q2 and the capacitor C1, and thereby the gate voltage Vgs(Q2) applied to the gate terminal of the switching element Q2 by the main control circuit 10 is reduced by the drain-source voltage Vds(Q1) of the switching element Q1 divided by using the gate capacitance Cgs(Q2) of the switching element Q2 and the capacitor C1. As a result, the change curve of the gate voltage Vgs(Q2) of the switching element Q2 is reduced from the curve illustrated with a solid line to the curve illustrated with a dashed line, as illustrated in FIG. 2B. As described above, the gate voltage Vgs(Q2) of the switching element Q2 having started turn-on behavior is reduced, and thus the characteristics of the drain current I(Q2) of the switching element Q2 is also reduced from the solid line to the dashed line as illustrated in FIG. 2B. Thereby, at the body diode D1 of the switching element Q1, the change (dI/dt) of the electric current I(Q1) is reduced during the recovery time.

Note that the drain-source voltage Vds(Q1) of the switching element Q1 is applied to the gate capacitance Cgs(Q2) of the switching element Q2 and the capacitor C1, and the voltage obtained by dividing the drain-source voltage Vds (Q1) is applied to the gate capacitance Cgs(Q2) of the switching element Q2. Hence, consideration is to be given to prevention of a situation in which the gate voltage Vgs(Q2) of the switching element Q2 exceeds a breakdown voltage between the gate and the source and destroys the switching element Q2.

That is, the gate voltage Vgs(Q2), which is the gate-source voltage of the switching element Q2, is expressed by the drain-source voltage Vds(Q1) of the switching element Q1 and a capacitance division ratio between the gate capacitance Cgs(Q2) of the switching element Q2 and the capacitor C1.

$$-Vgs(Q2)=Vds(Q1) \times C1/(C1+Cgs(Q2)) \quad (1)$$

In the following, Vgs(Q2)bd represents the breakdown voltage (allowable voltage) between the gate and the source of the switching element Q2, and Vds(Q1)max represents the maximum possible voltage applied between the drain and the source of the switching element Q1. In order to prevent the switching element Q2 from exceeding the breakdown voltage between the gate and the source, $$|Vgs(Q2)|<Vgs(Q2)bd \quad (2)$$

is to be established. When equation (1) is incorporated into this inequality (2), $$Vgs(Q2)bd>Vds(Q1) \times C1/(C1+Cgs(Q2)) \quad (3)$$

is established, and this inequality (3) is transformed to $$C1/(C1+Cgs(Q2))<Vgs(Q2)bd/Vds(Q1)max \quad (4).$$

That is, the ratio of the capacitance (first capacitance) of the capacitor C1 to the capacitance (fourth capacitance) obtained by adding the gate capacitance Cgs(Q2) (third capacitance) of the switching element Q2 to the capacitance of the capacitor C1 is preferably smaller than the ratio of the gate breakdown voltage of the switching element Q2 to the maximum possible voltage applied between the drain and the source of the switching element Q1.

Second Embodiment

Figure 3:
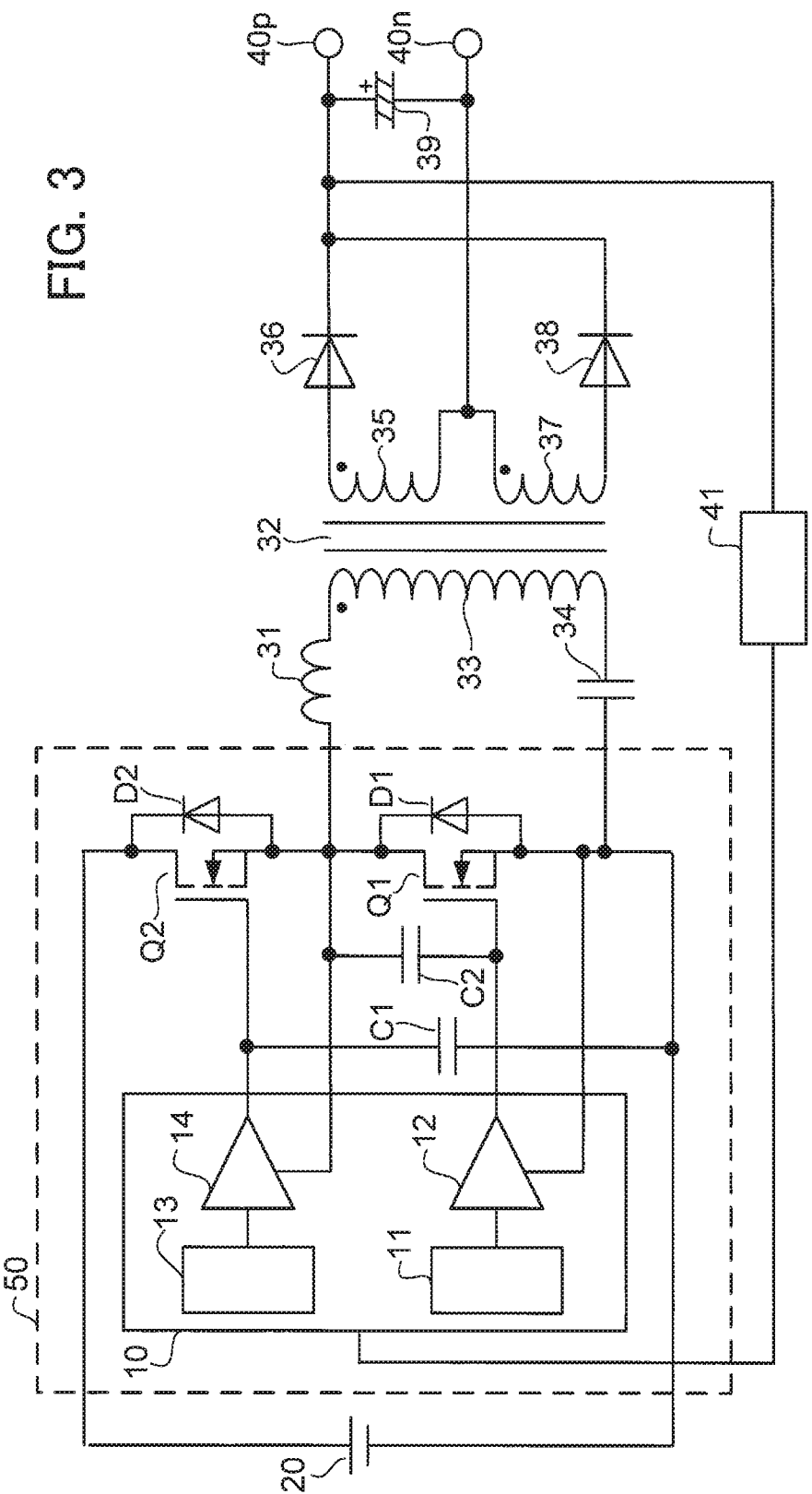
FIG. 3 is a circuit diagram illustrating a configuration example of a DC-DC converter that employs a drive circuit according to a second embodiment.
Figure 4A:
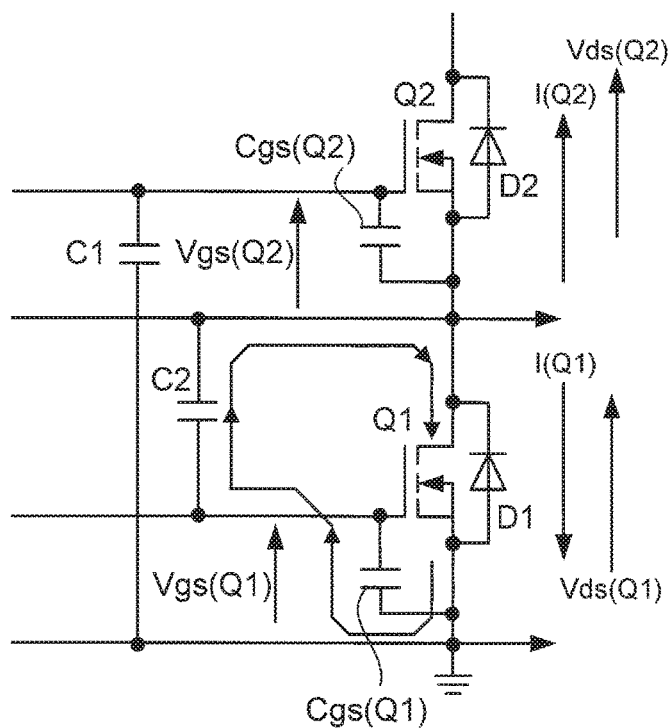
FIGS. 4A and 4B are diagrams for describing operation of a drive circuit according to the second embodiment.
Figure 4B:
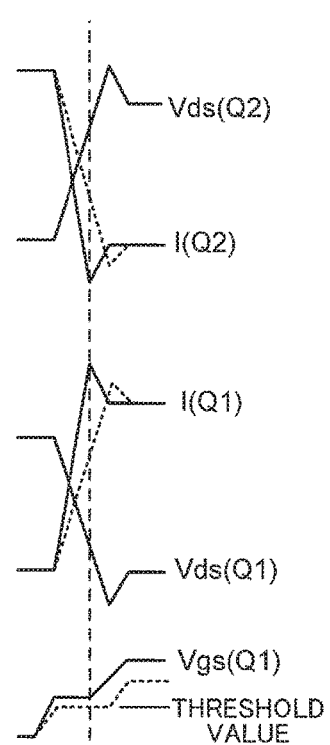
Figure 5:
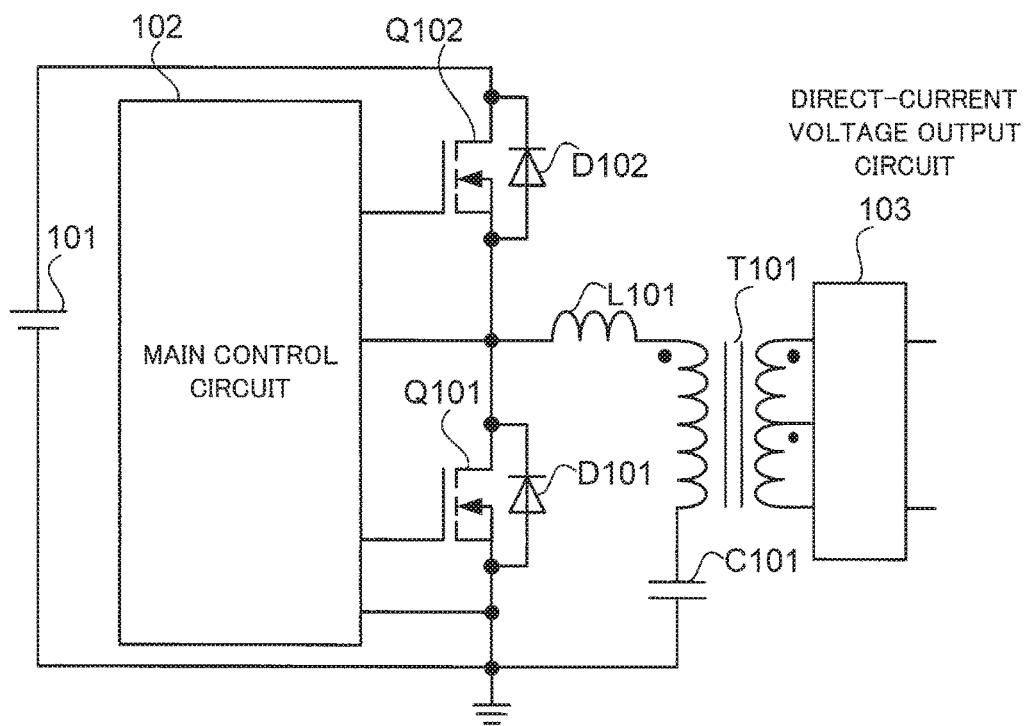
FIG. 5 is a circuit diagram partially illustrating an LLC current resonant DC-DC converter.

FIG. 3 is a circuit diagram illustrating a configuration example of a DC-DC converter that employs a drive circuit according to a second embodiment. FIGS. 4A and 4B are diagrams for describing the operation of the drive circuit according to the second embodiment. FIG. 4A illustrates an output circuit of the drive circuit. FIG. 4B illustrates the behavior performed when a resonance loss occurs. In FIG. 3, the components that are the same as or equivalent to the components illustrated in FIG. 1 are denoted with the same reference signs, and their detailed description will be omitted.

In the second embodiment, a terminal of a capacitor (second capacitive element) C2 is connected to the gate terminal of the low-side switching element Q1, and the other terminal of the capacitor C2 is connected to the source terminal, which is the low potential end, of the high-side switching element Q2. Components except this capacitor C2 are the same as those in the first embodiment. Thus, in the following, the behavior relevant to the added capacitor C2 is described mainly. Note that this capacitor C2 is provided outside the main control circuit 10 as illustrated in FIG. 3, but may be formed in a monolithic integrated circuit being the main control circuit 10.

Here, the effect of the capacitor C2 will be described. In the output circuit illustrated in FIG. 4A, the gate capacitance Cgs(Q1) of the low-side switching element Q1 is illustrated. FIG. 4B illustrates the drain-source voltage Vds(Q2) and the drain current I(Q2) of the high-side switching element Q2, and the drain current I(Q1), the drain-source voltage Vds (Q1), and the gate voltage Vgs(Q1) of the low-side switching element Q1, from the top of FIG. 4B. Note that the positive direction of the drain current I(Q2) of the high-side switching element Q2 is the direction flowing from the source terminal to the drain terminal.

Here, the electric current I(Q2) flows through the body diode D2 of the high-side switching element Q2 in the negative direction, immediately after the switching element Q1 is turned off, as in the fourth operation state of the LLC current resonant DC-DC converter. In this state, the switching element Q1 is turned on, when the main control circuit 10 is unable to follow the rapid change of the load and the input voltage and the gate voltage Vgs(Q1) exceeds a threshold value to turn on the switching element Q1. Thereby, the conductive body diode D2 is instantaneously subject to reverse bias, and the drain-source voltage Vds (Q2) of the switching element Q2 is rapidly subject to reverse bias to generate rapid turn-off dv/dt, and simultaneously turn-on dv/dt is generated in the drain-source voltage Vds(Q1) of the switching element Q1. This dv/dt causes the electric charge to move from the source of the switching element Q1 via the gate capacitance Cgs(Q1) of the switching element Q1 and the capacitor C2 to the drain of the switching element Q1, so as to flow the electric current in this loop. As a result, the gate voltage Vgs(Q1) maintained by the gate capacitance Cgs(Q1) of the switching element Q1 is lowered transiently, and the change (+dI/dt) of the electric current of the switching element Q2 is reduced consequently.

Moreover, the capacitor C2 connected to the gate terminal of the low-side switching element Q1 needs to be set to a capacitance value that does not destroy the switching element Q1. The gate voltage Vgs(Q1), which is the voltage between the gate and the source of the switching element Q1, is expressed by the drain-source voltage Vds(Q1) of the switching element Q1 and a capacitance division ratio between the gate capacitance Cgs(Q1) of the switching element Q1 and the capacitor C2.

$$Vgs(Q1)=Vds(Q1) \times C2/(C2+Cgs(Q1)) \quad (5)$$

In the following, Vgs(Q1)bd represents the breakdown voltage (allowable voltage) between the gate and the source of the switching element Q1, and Vds(Q1)max represents the maximum possible voltage applied between the drain and the source of the switching element Q1. In this case, in order to prevent the switching element Q1 from exceeding the breakdown voltage between the gate and the source, $$|Vgs(Q1)|<Vgs(Q1)bd \quad (6)$$

is to be established. When equation (5) is incorporated into this inequality (6), $$Vgs(Q1)bd>Vds(Q1) \times C2/(C2+Cgs(Q1)) \quad (7)$$

is established, and this inequality (7) is transformed to $$C2/(C2+Cgs(Q1))<Vgs(Q1)bd/Vds(Q1)max \quad (8).$$

That is, the ratio of the capacitance (second capacitance) of the capacitor C2 to the capacitance (sixth capacitance) obtained by adding the gate capacitance Cgs(Q1) (fifth capacitance) of the switching element Q1 to the second capacitance is preferably smaller than the ratio of the gate breakdown voltage of the switching element Q1 to the maximum possible voltage applied between the drain and the source of the switching element Q1.

Moreover, the capacitance value of the capacitor C2 is preferably equal to the capacitance value of the capacitor C1. Thereby, the property of the high side of the output circuit is identical with the property of the low side of the output circuit.

In the above, the preferable embodiments have been described, but the present disclosure is not limited to the above specific embodiments. For example, this drive circuit may be applied to a drive circuit for driving an inductive load, such as a motor.

The drive circuit and the semiconductor module of the above configuration have an advantage that the first capacitive element reduces the gate voltage supplied to the gate terminal of the second switch when the electric current flows through the first switch in the negative direction, and thus even if the second switch is turned on, its resultant change is reduced so as not to destroy the first switch.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A drive circuit comprising:
   a first switch located on a low side of the drive circuit;
   a second switch located on a high side of the drive circuit and connected in series with the first switch, the first switch and the second switch forming an output circuit, each of the first and second switches having a high-potential end, a low-potential end and a gate terminal;
   a control unit that controls switching operations of the first switch and the second switch; and
   a capacitive element having two ends thereof respectively connected to the gate terminal of the second switch and the low potential end of the first switch, the capacitive element being of a first capacitance, wherein
   a ratio of the first capacitance to a sum of the first capacitance and a third capacitance, the third capacitance being a capacitance between the gate terminal of the second switch and the low potential end of the second switch, is smaller than a ratio of a gate breakdown voltage of the second switch to a voltage applied between the high potential end of the first switch and the low potential end of the first switch.

2. The drive circuit according to claim 1, further comprising:
   another capacitive element having two ends thereof respectively connected to the gate terminal of the first switch and the low potential end of the second switch, said another capacitive element being of a second capacitance.

3. The drive circuit according to claim 2, wherein the first capacitance is equal to the second capacitance.

4. The drive circuit according to claim 2, wherein
   a ratio of the second capacitance to a sum of the second capacitance and a fifth capacitance, the fifth capacitance being a capacitance between the gate terminal of the first switch and the low potential end of the first switch, is smaller than a ratio of a gate breakdown voltage of the first switch to the voltage applied between the high potential end of the first switch and the low potential end of the first switch.

5. The semiconductor module according to claim 1, wherein
   the control unit is a monolithic integrated circuit, and
   at least one of the first capacitive element and the second capacitive element is formed in the monolithic integrated circuit.

6. The semiconductor module according to claim 1, wherein
   the control unit is a monolithic integrated circuit, and
   at least one of the first capacitive element and the second capacitive element is provided in a module.

7. A semiconductor module comprising:
   a first switch located on a low side of the semiconductor module;
   a second switch located on a high side of the semiconductor module and connected in series with the first switch, the first switch and the second switch forming an output circuit, each of the first and second switches having a high-potential end, a low-potential end and a gate terminal;
   a control unit that controls switching operations of the first switch and the second switch;
   a first capacitive element having two ends thereof respectively connected to the gate terminal of the second switch and the low potential end of the first switch, the first capacitive element being of a first capacitance, wherein
   a ratio of the first capacitance to a sum of the first capacitance and a third capacitance, the third capacitance being a capacitance between the gate terminal of the second switch and the low potential end of the second switch, is smaller than a ratio of a gate breakdown voltage of the second switch to a voltage applied between the high potential end of the first switch and the low potential end of the first switch; and
   a second capacitive element having two ends thereof respectively connected to the gate terminal of the first switch and the low potential end of the second switch, the second capacitive element being of a second capacitance, wherein
   a ratio of the second capacitance to a sum of the second capacitance and a fifth capacitance, the fifth capacitance being a capacitance between the gate terminal of the first switch and the low potential end of the first switch, is smaller than a ratio of a gate breakdown voltage of the first switch to the voltage applied between the high potential end of the first switch and the low potential end of the first switch, and
   the first capacitance of the first capacitive element is equal to the second capacitance of the second capacitive element.

8. The semiconductor module according to claim 7, wherein
   the control unit is a monolithic integrated circuit, and
   at least one of the first capacitive element and the second capacitive element is formed in the monolithic integrated circuit.

9. The semiconductor module according to claim 7, wherein
   the control unit is a monolithic integrated circuit, and
   at least one of the first capacitive element and the second capacitive element is provided in a module.

* * * * *